United States Patent
Bell et al.

(10) Patent No.: US 7,259,610 B1
(45) Date of Patent: Aug. 21, 2007

(54) STATIC CMOS LOGIC LEVEL SHIFT CIRCUIT WITH A LOW LOGIC INPUT COUNT HIGH SWITCHING SPEED AND LOW POWER DISSIPATION

(75) Inventors: Marshall J. Bell, Chandler, AZ (US); James R. Kozisek, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 124 days.

(21) Appl. No.: 10/949,111

(22) Filed: Sep. 24, 2004

(51) Int. Cl.
*H03L 5/00* (2006.01)

(52) U.S. Cl. .................. 327/333; 327/437; 326/68

(58) Field of Classification Search .............. 327/51, 327/55, 56, 57, 64, 67, 77, 112, 333, 437, 327/68, 81
See application file for complete search history.

(56) References Cited

U.S. PATENT DOCUMENTS

| | | | | |
|---|---|---|---|---|
| 4,039,862 A | * | 8/1977 | Dingwall et al. | 327/333 |
| 5,896,044 A | * | 4/1999 | Walden | 326/80 |
| 5,986,443 A | * | 11/1999 | Jeong | 323/312 |
| 6,593,795 B2 | * | 7/2003 | Cho | 327/333 |
| 6,633,192 B2 | * | 10/2003 | Tsuchiya | 327/333 |
| 6,664,809 B1 | * | 12/2003 | Chiu | 326/81 |
| 6,680,629 B2 | * | 1/2004 | Rankin et al. | 327/108 |
| 6,930,518 B2 | * | 8/2005 | Kim et al. | 327/112 |
| 2003/0042965 A1 | * | 3/2003 | Kanno et al. | 327/333 |
| 2004/0160262 A1 | * | 8/2004 | Kim et al. | 327/333 |
| 2005/0122155 A1 | * | 6/2005 | Tanaka et al. | 327/333 |
| 2005/0134355 A1 | * | 6/2005 | Maede et al. | 327/333 |
| 2005/0237099 A1 | * | 10/2005 | Tachibana et al. | 327/333 |
| 2005/0285658 A1 | * | 12/2005 | Schulmeyer et al. | 327/333 |

* cited by examiner

*Primary Examiner*—Dinh T. Le
(74) *Attorney, Agent, or Firm*—Darby & Darby PC; Matthew M. Gaffney

(57) ABSTRACT

A level shift circuit with high switching speed and low power dissipation is described. The circuit includes two short channel transistors, two long channel transistors, and two switching transistors. Short channel transistors are arranged to receive a high input voltage presenting relatively low impedance and low capacitance. Long channel transistors are arranged to receive a first voltage from the short channel transistors and provide an output voltage and an inverted output voltage, which are also employed to control the short channel transistors. A first switching transistor of the switching circuit enables the short channel and the long channel circuits to provide the output voltage based on a low input voltage and a logic input voltage. A second switching transistor enables the same circuits to provide the inverted output voltage based on the logic input voltage.

27 Claims, 4 Drawing Sheets

STATIC CMOS LOGIC LEVEL SHIFT CIRCUIT WITH A LOW LOGIC INPUT COUNT HIGH SWITCHING SPEED AND LOW POWER DISSIPATION

FIELD OF THE INVENTION

The present invention relates to level shifting circuits, and in particular, to a logic level shift circuit with low logic input count, high switching speed, low power dissipation.

BACKGROUND

In recent years, portable type electronic devices, such as portable telephones, notebook computers, personal digital assistants, and the like, are being widely used. Low voltage-type circuit devices, which are driven by a low voltage such as 3 Volts, have been employed to minimize current consumption of portable electronic devices and to make batteries used in the portable electronic devices last for longer time.

Level shift circuits are commonly employed between a power supply and an input/output ("I/O") portion of a microchip in portable electronic devices. Many conventional level shift circuits shift a voltage signal from a lower voltage level at the core power supply, e.g., 2.5 Volts, to a higher voltage level necessary for the I/O portion of the microchip.

With increasing performance demand on circuitry of portable electronic devices, level shift circuits are being designed to accommodate higher current demands, faster speeds, lower emission requirements, and the like.

Thus, it is with respect to these considerations and others that the present invention has been made.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment or an embodiment combining software and hardware aspects. The following detailed description is, therefore, not to be taken in a limiting sense.

Briefly stated, the present invention is directed to an improved level shift circuit with low logic input count, high switching speed, and low power dissipation. Two short channel transistors are employed in a level shift circuit that includes two long channel transistors. The short channel transistors are arranged to drive the long channel transistors, which are cross coupled with the short channel transistors. A low input voltage is provided directly to a gate of a first switching transistor, which controls an operation of one of the long channel/short channel transistor pairs. Because the relatively low impedance and low capacitance short channel transistors drive the long channel transistors, higher switching speeds may be employed without increasing crowbar currents. Crowbar currents are short-circuit currents from a positive power supply to a negative power supply or a ground. They occur commonly when both p-channel and n-channel drivers of a complementary output driver circuit are activated simultaneously.

By providing the low input voltage directly to a gate of the first switching transistor and coupling a drain of the first switching transistor to a gate of a second switching transistor, which is controlled by a logic input signal, an inversion of the logic input signal for controlling the first switching transistor is avoided.

Figure 1:
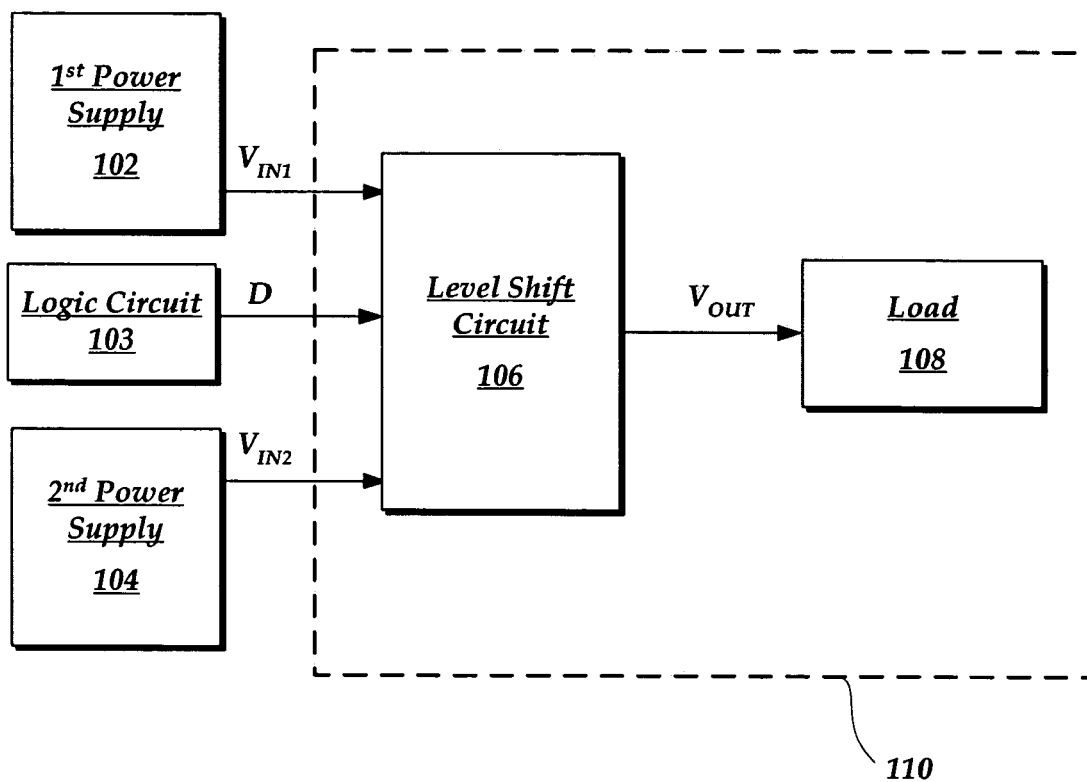
FIG. 1 is a block diagram illustrating an environment in which one embodiment of a level shift circuit may operate.

FIG. 1 illustrates block diagram 100 of an environment, in which one embodiment of a level shift circuit may operate. Block diagram 100 includes first power supply 102, second power supply 104, level shift circuit 106, and load 108. In one embodiment, an integrated circuit 110 may comprise level shift circuit 106 and load 108.

In integrated circuits, logic signals from different power supplies are commonly interfaced and shifted for use by various subcircuits in the integrated circuit. Level shift circuit 106 is arranged to receive power supply voltage $V_{IN1}$ from first power supply 102, power supply voltage $V_{IN2}$ from second power supply 104, and logic input signal D from logic circuit 103; and to provide output voltage $V_{OUT}$ to load 108. In one embodiment, logic circuit 103, which is arranged to provide D, may use $V_{IN2}$ as its logic supply voltage, e.g. a high value for D may be $V_{IN2}$ and a low value for D may be about zero Volts (ground). By performing level shifting, level shift circuit 106 may provide logic output voltage $V_{OUT}$, which varies between about zero Volts and $V_{IN1}$, to yet another circuit, such as load 108. Accordingly, $V_{IN1}$ is a high value of $V_{OUT}$ and about zero Volts is a low value for $V_{OUT}$. In another embodiment, logic circuit 103 and second power supply 104 may be the same circuit.

Load 108 may include virtually any subcircuit of the integrated circuit as well as an external load such as a circuit on another chip.

Figure 2:
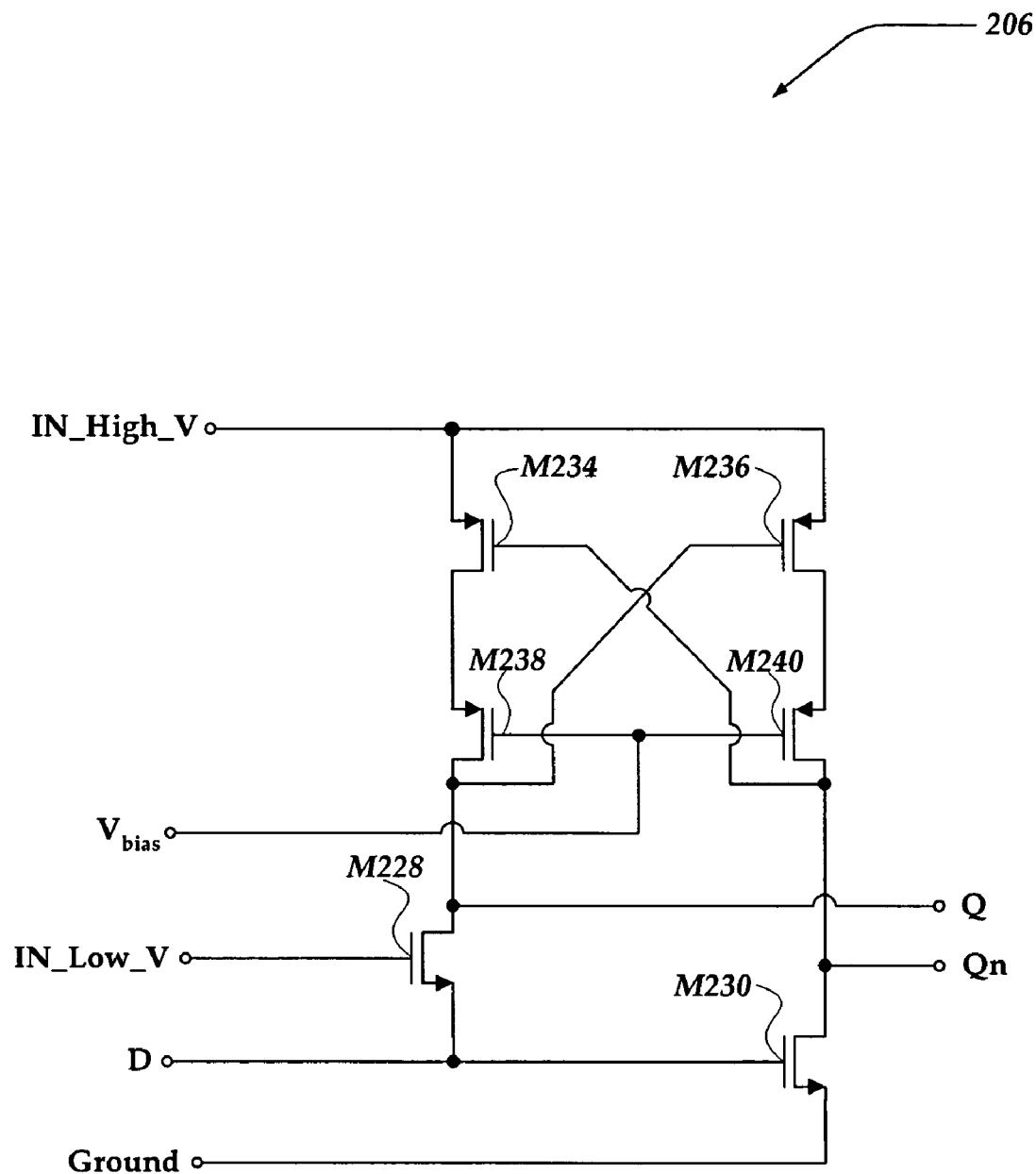
FIG. 2 schematically illustrates an embodiment of the level shift circuit of FIG. 1 according to the present invention.

Previous implementations of level shift circuits may include a pair of cross-coupled long channel transistors, such as those shown in FIG. 2, which are arranged to provide a high impedance and a high capacitance to enable level shift circuit 106 to switch states and provide $V_{OUT}$. The high impedance and the high capacitance of the long channel transistors may result in slower switching speeds and higher crowbar currents as described previously.

According to one aspect of the present invention, a pair of short channel transistors is included in level shift circuit 106. The short channel transistors are arranged to drive the long channel transistors instead of driving each other. This results in lower impedance, enabling faster switching rates and lower crowbar currents.

FIG. 1 shows a particular arrangement of inputs and outputs of the various components. Other arrangements of the components may be implemented without departing from the scope and spirit of the present invention.

FIG. 2 schematically illustrates an embodiment of level shift circuit 206. Level shift circuit 206 illustrates one possible implementation of level shift circuit 106 of FIG. 1 according to one aspect of the present invention. Level shift circuit 206 includes short channel transistors M234 and M236, long channel transistors M238 and M240, and switch transistors M228 and M230.

Level shift circuit 206 may enable faster switching speeds with the addition of short channel transistors, resulting in a lower capacitance seen by long channel transistors M238 and M240. Overall lower capacitance of the transistor pairs may reduce the crowbar currents as well. Finally, a control of switch transistor M228 by IN_Low_V instead of Dn may make an inverter unnecessary, avoiding an increase in an overall part count of the integrated circuit. Previous implementations of level shift circuits may employ input logic voltage D and its inverted companion Dn, which makes at least one additional inverter part of the circuitry. This in return results in higher component count, a critical design parameter for integrated circuits.

Short channel transistors M236 and M234 are both arranged to receive IN_High_V at their source. A drain of M234 and a drain of M236 are coupled to a source of M238 and a source of M240, respectively. A drain of long channel transistor M238 is coupled to a drain of switch transistor M228 and, similarly, a drain of M240 is coupled to a drain of M230. While gates of long channel transistors M238 and M240 are coupled together and arranged to receive bias voltage $V_{bias}$, a gate of short channel transistor M234 is coupled to the drain of long channel transistor M240. A gate of short channel transistor M236 is coupled to the drain of long channel transistor M238. This cross-coupling enables a control of short channel transistors M234 and M236 by a state of switch transistors M230 and M228, respectively. Accordingly, when M228 is conducting, short channel transistor M236 may be turned on, and conversely M234 may be turned on, when switch transistor M230 is conducting.

Switch transistor M230 is controlled by input logic voltage D, provided to its gate, enabling M230 to conduct between the drain of long channel transistor M240 and a ground. Switch transistor M228, on the other hand, is arranged to receive D at its drain, and is controlled by IN_Low_V, provided to a gate of M228. Through this direct control of M228 by IN_Low_V, an inverter to provide Dn for controlling switch transistor M228 may be unnecessary.

In a typical operation, $V_{bias}$ activates both long channel transistors M238 and M240, and keeps them active as long as $V_{bias}$ is provided. A high value of D activates switch transistor M230. When M230 conducts, a value of inverted output voltage Qn becomes about zero Volts or low. Because a high value of D is substantially equal to IN_Low_V, M228 may be turned off with substantially the same voltage being applied to its gate and source. M230 being active may turn on short channel transistor M234 through the cross-coupling from the drain of M230 to the gate of M234, and enable Q to have a high value, which is substantially IN_High_V. On the other hand, switch transistor M228 being turned off may turn short channel transistor M236 off as well with Qn having a low value.

When a transition of D to a low value of about zero Volts occurs, switch transistor M230 may be turned off and switch transistor M228 may be turned on, because IN_Low_V is still being provided to the gate of M228. Through the same cross-coupling mechanism as described above, the states of M228 and M230 may lead to short channel transistor M236 being activated and M234 being turned off. This in return may result in a low value for Q and a high value for Qn tracking D. In one embodiment, a voltage value other than about zero Volts may be applied instead of a ground and a low value for D and Q (Qn as well) may be the voltage value other than about zero Volts.

Throughout the operation of level shift circuit 206, long channel transistors M238 and M240 may be active through application of $V_{bias}$ to their gates, and conduct a voltage provided by short channel transistors M234 and M236, respectively. A low impedance and capacitance of short channel transistors M234 and M236 enables level shift circuit 206 to switch faster. In one embodiment, a switching speed may be increased up to two times that of a switching speed of a level shift circuit without the long channel transistors. The low capacitance of short channel transistors M234 and M236 may also reduce a crowbar current of level shift circuit 206, which flows when both sides of the circuit are turned on during a transition. In another embodiment, the crowbar current may be reduced by as much as one half compared to a level shift circuit without the short channel stage.

In a further embodiment, long channel transistors M238 and M240 may be replaced by a pair of resistors with impedances that are substantially equal to the impedances of long channel transistors M238 and M240. Bias voltage $V_{bias}$ may be predetermined as appropriate for long channel transistors M238 and M240. In general, a criterion for $V_{bias}$ may be defined as: the lower a value of $V_{bias}$, the longer a channel length of M238 and M240. However, other considerations may be taken into account in determining a channel length of long channel transistors M238 and M240, such as design constraints, appropriate impedance and capacitance, and the like. Accordingly, $V_{bias}$ may be optimized based on a channel length determination for M238 and M240.

While FIG. 2 illustrates an implementation of level shift circuit 206 employing MOSFET transistors, MES-FET technology may also be employed. FIG. 2 shows a particular arrangement of inputs and outputs of the various components. In one embodiment, all of the components of level shift circuit 206 may be included in the same chip. Alternatively, one or more of the components may be off-chip.

Figure 3:
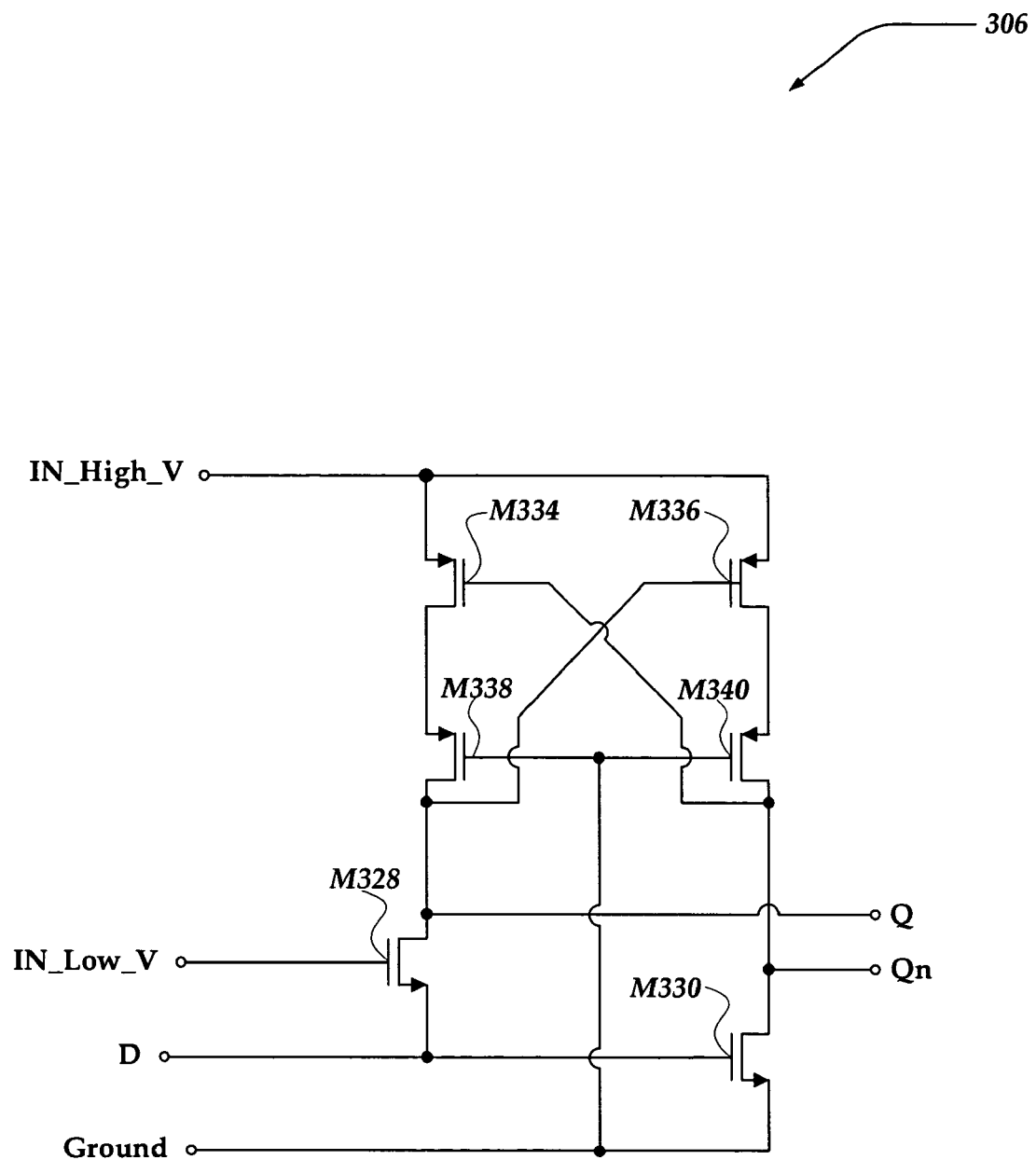
FIG. 3 schematically illustrates an embodiment of the level shift circuit of FIG. 2 with biasing based on a ground.

FIG. 3 schematically illustrates an embodiment of level shift circuit 306, which is an implementation of level shift circuit 206 of FIG. 2 with biasing based on a ground. Level shift circuit 306 includes short channel transistors M334 and M336, long channel transistors M338 and M340, and switch transistors M328 and M330.

Short channel transistors M334 and M336, long channel transistors M338 and M340, and switch transistors M328 and M330 shown in FIG. 3, which are similarly named in FIG. 2, operate in substantially the same way as discussed above. In level shift circuit 306, switch transistors M338 and M340 are provided a ground voltage as biasing voltage at their gates. As described above, a lower value of the biasing voltage may result in use of longer channel lengths for M338 and M340.

Figure 4:
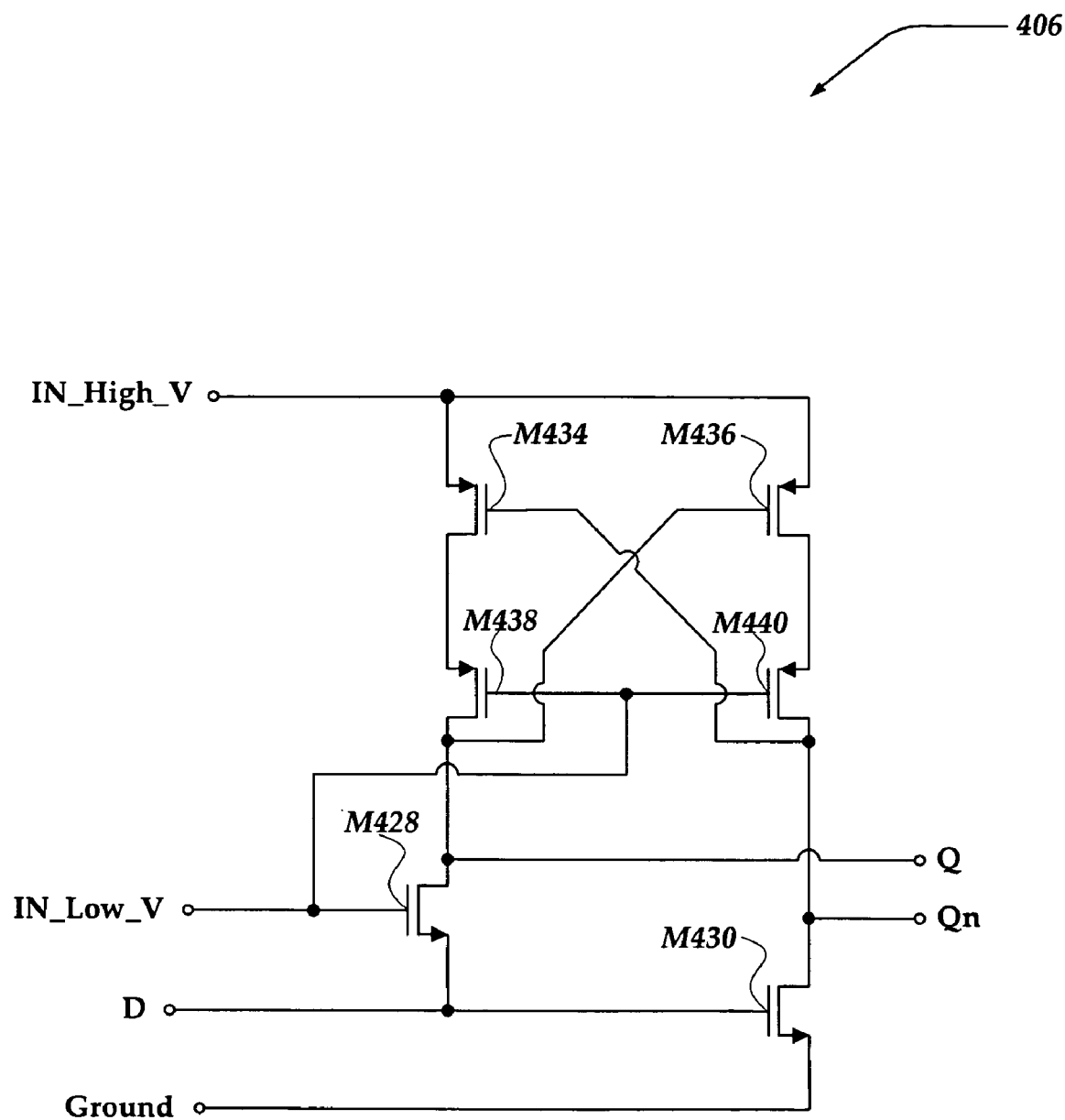
FIG. 4 schematically illustrates an embodiment of the level shift circuit of FIG. 2 with biasing based on a lower input voltage.
Figure 1:
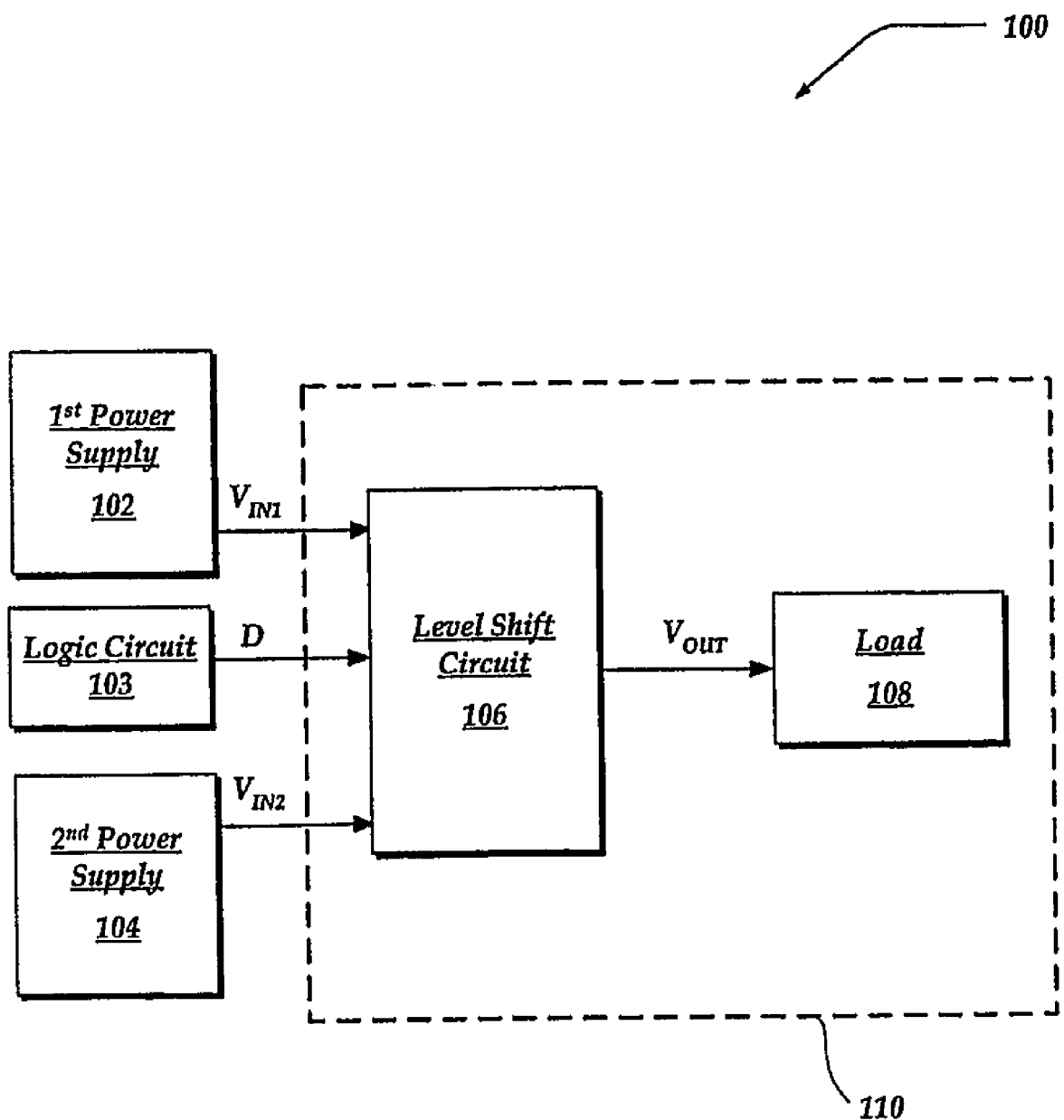

FIG. 4 schematically illustrates an embodiment of level shift circuit 406, which is an implementation of level shift circuit 206 of FIG. 2 with biasing based on low input voltage IN_Low_V. Level shift circuit 406 includes short channel transistors M434 and M436, long channel transistors M438 and M440, and switch transistors M428 and M430.

Short channel transistors M434 and M436, long channel transistors M438 and M440, and switch transistors M428 and M430 shown in FIG. 4, which are similarly named in FIG. 2, operate in substantially the same way as discussed previously. In level shift circuit 406, switch transistors M438 and M440 are provided low input voltage IN_Low_V as a biasing voltage at their gates. A higher value of the biasing voltage may result in use of shorter channel lengths for long channel transistors M438 and M440.

The above specification, examples and data provide a description of the manufacture and use of the composition of the invention. Since many embodiments of the invention can be made without departing from the spirit and scope of the invention, the invention also resides in the claims hereinafter appended.

We claim:

1. A level shift circuit comprising:
    a short channel stage that is arranged to receive an upper input voltage, and to provide a first voltage in response to the upper input voltage, wherein the short channel stage includes one or more short channel components;
    a long channel stage that is arranged to receive the first voltage and a bias voltage, and to provide an output voltage in response to the first voltage and the bias voltage such that the output voltage tracks a logic input voltage and an upper value for the output voltage is based on the upper input voltage, wherein the long channel stage includes one or more long channel components, and wherein each of the one or more short channel components has a channel length that is less than a channel length of each of the one or more long channel components; and
    a switching stage that is arranged to control, in part, the long channel stage and the short channel stage based, in part, on a lower input voltage and the logic input voltage, wherein the long channel stage is further arranged to provide an inverted output voltage having a logical level that is inverted relative to the output voltage, and wherein the switching stage is arranged such that providing the inverted output voltage is achieved in such a way that logical inversion of the logic input voltage is unnecessary.

2. The circuit of claim 1, wherein the switching stage is configured to control the long channel stage and the short channel stage by performing actions including:
    activating a first portion of the long channel stage and a first portion of the short channel stage based on the lower input voltage and the logic input voltage; and
    activating a second portion of the long channel stage and a second portion of the short channel stage based on the logic input voltage.

3. The circuit of claim 2, wherein the long channel stage and the short channel stage are arranged such that the upper input voltage and the lower input voltage correspond to a logic high level and a logic low level, respectively, of an input voltage; and the upper value for the output voltage and a lower value for the output voltage correspond to another logic high level and another logic low level, respectively, for the output voltage.

4. The circuit of claim 3, wherein the upper input voltage is about 2.5 Volts, the lower input voltage is about zero Volts, the upper output voltage is about five Volts, and the lower output voltage is about zero Volts.

5. The circuit of claim 1, wherein the short channel stage comprises a first transistor and a second transistor that are arranged as follows:
    a source of the first transistor and a source of the second transistor are coupled together and arranged to receive the upper input voltage, wherein the long channel stage includes a third transistor and a fourth transistor;
    a gate of the first transistor and a gate of the second transistor are cross-coupled to a drain of the fourth transistor and a drain of the third transistor, respectively; and
    a drain of the first transistor and a drain of the second transistor are coupled to a source of the third transistor and a source of the fourth transistor, respectively, of the long channel circuit.

6. The circuit of claim 1, wherein the long channel stage comprises a third transistor and a fourth transistor that are arranged as follows:
    a source of the third transistor and a source of the fourth transistor are coupled to a drain of a first transistor and a drain of a second transistor, respectively, of the short channel circuit;
    a gate of the third transistor and a gate of the fourth transistor are coupled together and arranged to receive the bias voltage; and
    a drain of the third transistor and a drain of the fourth transistor are coupled to a source of a first switching transistor and a second switching transistor, respectively, of the switching stage.

7. The circuit of claim 6, wherein a length-to-width ratio of the third transistor and the fourth transistor is at least ten.

8. The circuit of claim 6, wherein the drain of the third transistor is arranged to provide the output voltage.

9. The circuit of claim 6, wherein the drain of the fourth transistor is arranged to provide an inverted output voltage.

10. The circuit of claim 6, wherein the gates of the third transistor and the fourth transistor are arranged to receive the lower input voltage as the bias voltage.

11. The circuit of claim 6, wherein the gates of the third transistor and the fourth transistor are arranged to receive a ground voltage as the bias voltage.

12. The circuit of claim 1, wherein the long channel stage and the short channel stage are arranged such that a crowbar current flows through the circuit between an upper input voltage and a ground, if the first portion of the long channel stage and the first portion of the short channel stage are activated at the same time as the second portion of the long channel stage and the second portion of the short channel stage.

13. The circuit of claim 12, wherein the short channel stage is configured to enable a reduction of the crowbar current.

14. The circuit of claim 1, wherein the long channel stage and the short channel stage each comprise a pair of transistors, and wherein each transistor of each pair includes one of a MOSFET and a MESFET.

15. The circuit of claim 1, wherein the long channel stage is arranged to receive a bias voltage, and to provide the output voltage and the inverted output voltage based on the first voltage and the bias voltage such that a level of the output voltage and a level of the inverted output voltage is shifted.

16. The circuit of claim 15, wherein the bias voltage is one of the lower input voltage or a ground voltage.

17. The circuit of claim 1, wherein the upper input voltage and the lower input voltage represent a logic high level and a logic low level, respectively, of an input voltage.

18. The circuit of claim 1, wherein a junction area ratio between a pair of transistors of the long channel stage and another pair of transistors of the short channel stage is at least twenty.

19. The level shift circuit of claim 1, wherein the one or more short channel components include a first short channel field effect transistor.

20. The level shift circuit of claim 1, wherein the one or more short channel components include a first short channel field effect transistor, and wherein the channel length of the first short channel transistor is small relative to the transistor process of the first transistor.

21. A circuit, comprising:
a level shift circuit, including:
a first transistor having at least a gate, a drain, and a source, wherein the source of the first transistor is coupled to a power supply rail node;
a second transistor having at least a gate, a drain, and a source, wherein the source of the second transistor is coupled to the power supply rail node;
a first device that is coupled between the drain of the first transistor and a first level shift output node;
a second device that is coupled between the drain of the second transistor and a second level shift output node;
a first switch that is coupled to the first level shift output node; and
a second switch that is coupled to the second level shift output node, wherein the first switch circuit is coupled between the first level shift output node and a logic input node, the second switch circuit is coupled between the second level shift input node and another power supply rail node, and wherein the second switch circuit has a control input that is coupled to the logic input node.

22. The circuit of claim 21, wherein
the first device is a third transistor having at least a gate, a drain, and a source, wherein the source of the third transistor is coupled to a drain of the first transistor, and wherein the drain of the third transistor is coupled to the gate of the second transistor; and
wherein the second device is a fourth transistor having at least a gate, a drain, and a source, wherein the source of the fourth transistor is coupled to a drain of the second transistor; the drain of the fourth transistor is coupled to the gate of the first transistor; the first transistor is a short-channel transistor such that the first transistor has a relatively small channel length, such that the channel length of the first transistor is less than a channel length of the third transistor and less than a channel length of the fourth transistor; the second transistor has a relatively small channel length, such that the channel length of the second transistor is less than the channel length of the third transistor and less then the channel length of the fourth transistor; the gate of the fourth transistor is connected to the gate of the third transistor; and wherein the common gate of the third and fourth transistors is arranged to be driven by a static bias voltage.

23. The circuit of claim 21,
wherein the first and second transistor each have a channel length that is small relative to the transistor process of the first and second transistor.

24. The circuit of claim 21, wherein the first device is a first resistor, and wherein the second device is a second resistor.

25. The circuit of claim 21, wherein the first device is a third transistor, and wherein the second device is a fourth transistor.

26. The circuit of claim 21, wherein said another power supply rail node is ground.

27. The circuit of claim 21, wherein
the first switch circuit includes a third transistor having at least a drain that is coupled to the first level shift output node, a source that is coupled the logic input node, and a gate that is coupled to yet another power supply rail node, wherein the level shift circuit is arranged to receive a logic input signal at the logic input node, and to provide a first level shift output signal at the first level shift output node such that the first level shift output signal is level shifted relative to the logic input signal such that a logic high for the logic input signal corresponds to a first high supply voltage and such that the level shift output signal correspond to a second high supply voltage if the logic input signal corresponds to a logic high; and wherein the level shift circuit is further arranged to receive the first high supply voltage at said yet another supply rail node, and to receive the second high supply voltage at the power supply rail node; and
the second switch circuit includes a fourth transistor having at least a drain that is coupled to the second level shift output node, a source that is coupled to said another power supply rail node, and a gate that is coupled to the logic input node.

* * * * *

UNITED STATES PATENT AND TRADEMARK OFFICE
CERTIFICATE OF CORRECTION

PATENT NO. : 7,259,610 B1  Page 1 of 2
APPLICATION NO. : 10/949111
DATED : August 21, 2007
INVENTOR(S) : Bell et al.

It is certified that error appears in the above-identified patent and that said Letters Patent is hereby corrected as shown below:

On Sheet 1 of 4, in Fig. 1, line 1, below "US 7,259,610 B1" insert

--  --. As shown in the attached.

In column 8, line 8, in Claim 22, delete "then" and insert -- than --, therefor.

Signed and Sealed this

Twenty-fifth Day of December, 2007

JON W. DUDAS
*Director of the United States Patent and Trademark Office*